(12) United States Patent
Howard et al.

(10) Patent No.: US 10,062,644 B2
(45) Date of Patent: Aug. 28, 2018

(54) COPPER INTERCONNECT FOR IMPROVING RADIO FREQUENCY (RF) SILICON-ON-INSULATOR (SOI) SWITCH FIELD EFFECT TRANSISTOR (FET) STACKS

(71) Applicant: Newport Fab, LLC, Newport Beach, CA (US)

(72) Inventors: David J. Howard, Irvine, CA (US); Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/256,318

(22) Filed: Sep. 2, 2016

(65) Prior Publication Data

US 2018/0068941 A1     Mar. 8, 2018

(51) Int. Cl.
*H01L 23/488* (2006.01)
*H01L 21/283* (2006.01)
(Continued)

(52) U.S. Cl.
CPC ...... *H01L 23/528* (2013.01); *H01L 21/76816* (2013.01); *H01L 21/76877* (2013.01);
(Continued)

(58) Field of Classification Search
CPC ............ H01L 23/528; H01L 23/53214; H01L 21/76816; H01L 21/84; H01L 21/8238; H01L 28/60; H01L 21/76877; H01L 23/53228; H01L 23/66; H01L 23/5226; H01L 27/1203; H01L 27/092; H01L 2223/6616; H01L 23/481; H01L 27/0688;
(Continued)

(56) References Cited

U.S. PATENT DOCUMENTS

| | | | | |
|---|---|---|---|---|
| 8,835,319 B2 * | 9/2014 | Meinhold | ........... | H01L 21/7685 257/762 |
| 2004/0000669 A1 * | 1/2004 | Yamamura | .......... | H01L 27/1462 257/72 |

OTHER PUBLICATIONS

Goss et al. "The Challenges of Nitride Spacer Processing for a 0.35um CMOS Technology", 1997, IEEE Advanced Semiconductor Manufacturing Conference, pp. 228-233.
(Continued)

*Primary Examiner* — Marcos D Pizarro
*Assistant Examiner* — Nelson Garces
(74) *Attorney, Agent, or Firm* — Bever, Hoffman & Harms, LLP

(57) ABSTRACT

A radio frequency (RF) switch includes a plurality of silicon-on-insulator (SOI) CMOS transistors. A first metal layer (M1) includes traces that connect the SOI CMOS transistors in series to form the RF switch. The first metal layer has a first metal composition. Additional metal layers, having a second metal composition, are formed over the first metal layer. In one embodiment the first metal composition is copper, and the second metal composition is a primarily aluminum composition. In one embodiment, first metal layer is fabricated using a process node having a first minimum line width, and the additional metal layers are fabricated using a process node having a second minimum line width, greater than the first minimum line width. The first metal layer exhibits a reduced resistance and capacitance, thereby reducing the on-resistance and off-capacitance of the RF switch.

17 Claims, 4 Drawing Sheets

(51) Int. Cl.
 *H01L 23/532* (2006.01)
 *H01L 23/522* (2006.01)
 *H01L 23/528* (2006.01)
 *H01L 27/088* (2006.01)
 *H01L 27/092* (2006.01)
 *H01L 27/12* (2006.01)
 *H01L 23/66* (2006.01)
 *H01L 49/02* (2006.01)
 *H01L 21/8238* (2006.01)
 *H01L 21/84* (2006.01)
 *H01L 21/768* (2006.01)

(52) U.S. Cl.
 CPC .......... *H01L 21/8238* (2013.01); *H01L 21/84* (2013.01); *H01L 23/5226* (2013.01); *H01L 23/53214* (2013.01); *H01L 23/53228* (2013.01); *H01L 23/66* (2013.01); *H01L 27/092* (2013.01); *H01L 27/1203* (2013.01); *H01L 28/60* (2013.01); *H01L 2223/6616* (2013.01)

(58) Field of Classification Search
 CPC ..... H01L 2223/6677; H01L 21/823475; H01L 27/088; H01L 2224/0231; H01L 2924/1421; H01L 23/5386
 See application file for complete search history.

(56) References Cited

OTHER PUBLICATIONS

Wolf; "Improving the Short-Channel Performance of the conventional NMOS LDD", 1995, Silicon Processing for the VLSI Era vol. 3—The Submicron MOSFET, Chapter 9.11.3, pp. 621-622.

Wolf; "Modeling Eymax in LDD MOSFETs", 1995, Silicon Processing for the VLSI Era vol. 3—The Submicron MOSFET, Chapter 9.6.1, pp. 592-595.

\* cited by examiner

COPPER INTERCONNECT FOR IMPROVING RADIO FREQUENCY (RF) SILICON-ON-INSULATOR (SOI) SWITCH FIELD EFFECT TRANSISTOR (FET) STACKS

FIELD OF THE INVENTION

The present invention relates to a radio frequency (RF) switch including a plurality of silicon-on-insulator (SOI) CMOS transistors, a first metal layer (M1) used to connect the SOI CMOS transistors, and a plurality of additional metal layers fabricated over the first metal layer. The first metal layer has a first metal composition (e.g., copper), and the additional metal layers have a second metal composition (e.g., primarily aluminum).

RELATED ART

FIG. 1 is a circuit diagram of a conventional radio frequency (RF) circuit 100, including an antenna 101, an RF receiver switch 110, an RF receiver port 115, an RF transmitter switch 120 and an RF transmitter port 125. RF receiver switch 110 includes a plurality of high-voltage field effect transistors (FETs) $110_1$-$110_N$, which are connected in series (in a stack). The stack of high voltage FETs $110_1$-$110_N$ is controlled to route RF signals from antenna 101 to receive port 115. Similarly, RF transmitter switch 120 includes a stack of high-voltage FETs $120_1$-$120_N$, which are controlled to route RF signals from transmit port 125 to antenna 101. As used herein, an RF signal is defined as a signal having a frequency in the range of about 10 kHz to 50 GHz. The FETs used in the switch branch stack are large, typically 1-5 mm (millimeter) in total width. It is understood that FIG. 1 is a simplified schematic for illustrative purposes and that many features of a full RF switch product related to biasing, voltage balance, etc. are not shown.

Silicon-on-insulator (SOI) CMOS technologies are now the dominant platforms for creating best-in-class radio frequency switch (RFSW) products for handsets and other mobile devices. Thus, transistors $110_1$-$110_N$ and $120_1$-$120_N$ are typically implemented using SOI CMOS transistors. Such SOI CMOS transistors enable the associated RF switches 110 and 120 to transmit RF signals in the range of 0.5 GHz to 6 GHz with a high degree of linearity, while withstanding voltages of 40V to 70V and in an off-state. Because SOI CMOS technology uses standard CMOS technologies and standard cell libraries, RF switches that implement SOI CMOS transistors can be readily integrated into larger system-on-chip (SOC) devices, thereby minimizing fabrication costs.

For RF switch 110 (or 120), the on-resistance of the switch ($R_{ON}$) multiplied by the off-capacitance of the switch ($C_{OFF}$) is a key figure of merit, which dictates the ability to transmit RF power with low losses through on-state transistor stacks, while maintaining adequate isolation across off-state transistor stacks. The thin film SOI CMOS transistors are attractive for RF switch applications, because these transistors reduce the junction capacitance component of the off-capacitance value, $C_{OFF}$.

Typically, the off-state stacks of an RF switch need to hold off relatively high voltage RF signals (e.g., 40-70V). Consequently, RF switches are implemented with older generation SOI CMOS transistors having operating voltages in the 2.5 Volt-5 Volt range. These older generation SOI CMOS transistors are fabricated using process nodes with a minimum feature size of 0.18 microns or greater. In general, the gate length of each of transistors $110_1$-$110_N$ and $120_1$-$120_N$ must be about 0.2 microns or more to provide the required off-state isolation. Note that transistors fabricated using more advanced process nodes (e.g., a 0.13 micron process node) have lower operating voltages (e.g., 1.2 Volts or lower), and are not suitable for implementing an RF switch.

Silicon processing technologies used to fabricate SOI CMOS transistors having the required feature sizes (0.18 microns and up) and operating voltages (2.5 Volts and up) employ a back end of line (BEOL) interconnect structure that includes metal traces having a primarily aluminum composition. That is, aluminum has specific impurities added, for reliability reasons. As defined herein, a primarily aluminum composition includes at least about 99% aluminum by weight. Three possible primarily aluminum compositions include Al—Si, Al—Si—Cu and Al—Cu, wherein the silicon or copper compositions are less than 1% by weight. A typical primarily aluminum composition is Al—Cu with 0.5% copper by weight. As defined herein, an aluminum trace is a metal trace having a primarily aluminum composition.

FIG. 2 is a cross-sectional view of a conventional SOI CMOS structure 200, which includes n-channel SOI CMOS transistor 201 and p-channel SOI CMOS transistor 202, which are fabricated using a conventional 0.18 micron SOI CMOS process node. Transistors similar to n-channel SOI CMOS transistor 201 can be used to implement each of transistors $110_1$-$110_N$ and $120_1$-$120_N$ of RF switches 110 and 120. Transistors similar to n-channel SOI CMOS transistor 201 and p-channel SOI CMOS transistor 202 can be used to implement circuitry found within receive port 115 and transmit port 125.

SOI CMOS transistors 201-202 are fabricated on a thin silicon layer 205, which is located on an insulator 204 (e.g., silicon oxide), which in turn, is located on a substrate 203 (e.g., monocrystalline silicon).

N-channel SOI CMOS transistor 201 includes an n-type source region 211 (which includes lightly doped source region 211A and source contact region 211B), an n-type drain region 212 (which includes lightly doped drain region 212A and drain contact region 212B), gate dielectric 215, polysilicon gate 217, dielectric sidewall spacers 219-220 and metal silicide regions 223-225. A p-type channel region 209 exists between the source region 211 and the drain region 212.

P-channel SOI CMOS transistor 202 includes a p-type source region 213 (which includes lightly doped source region 213A and source contact region 213B), a p-type drain region 214 (which includes lightly doped drain region 214A and drain contact region 214B), gate dielectric 216, polysilicon gate 218, dielectric sidewall spacers 221-222 and metal silicide regions 226-228. An n-type channel region 210 exists between the source region 213 and the drain region 214.

A multi-layer interconnect structure is fabricated over transistors 201-202, thereby providing electrical connections to these transistors (and other devices fabricated in the thin silicon layer 205). In the example illustrated, a pre-metal dielectric (PMD) structure 203 having a thickness T1 of about 0.85 microns and a dielectric constant $\varepsilon=4.2$ is formed over transistors 201-202. Tungsten (W) contacts 231, 232, 233 and 234 extend through the PMD layer 230 and contact the silicide regions 223, 225, 226 and 228, respectively, as illustrated. A first metal layer (M1), including aluminum traces 241-244, is formed over PMD layer 230. It is understood that the first metal layer M1 also includes thin metallic layers (not shown), which are formed above and below aluminum traces 241-244. For example, the first metal layer may include, from the bottom up, titanium (Ti), titanium nitride (TiN), AlCu, Ti and TiN. The first metal layer M1 has a thickness T2 of about 0.52 microns. A dielectric structure 240 having a thickness T3 of about 1.27 microns and a dielectric constant ε=4.2 is formed over the PMD structure 230 and the first metal layer (M1). Tungsten vias 245-248 (each having a thickness T4 of about 0.75 microns) extend through the dielectric structure 240 to provide contact to aluminum traces 241-244, respectively, of the first metal layer.

A second metal layer (M2), including aluminum traces 251-255 and thin metallic layers having the same configuration as the first metal layer M1, is formed over dielectric structure 240. The second metal layer M2 has a thickness T5 of about 0.52 microns. A thin insulating layer 261 (e.g., silicon nitride having a thickness of about 250-600 Angstroms), is formed over aluminum trace 255. A thin conductive layer 262 (e.g., titanium nitride (TiN) having a thickness of about 1500-2500 Angstroms), is formed over insulating layer 261, thereby forming a conventional metal-insulator-metal (MIM) structure 260 (e.g., capacitor). The thickness of thin insulating layer 261 is selected to control the target capacitance density of the MIM structure 260. A dielectric structure 250 having a thickness T6 of about 1.27 microns and a dielectric constant ε=4.2 is formed over the dielectric structure 240 and the second metal layer. Tungsten vias 256 and 257 (each having a thickness T7 of about 0.75 microns) extend through the dielectric structure 250 to provide contact to aluminum traces 251 and 254, respectively, of the second metal layer. Similarly, tungsten via 258 extends through the dielectric structure 250 to provide contact to the thin conductive layer 262 of MIM structure 260.

Additional alternating metal layers, metal vias and insulating structures are formed over the dielectric structure 250 in a manner known to those in the art. For example, FIG. 2 illustrates aluminum traces 271-272 of a third metal layer (M3) formed over the dielectric structure 250.

In accordance with the conventional 0.18 micron SOI CMOS process node described above, each of the aluminum traces 241-444, 251-255 and 271-272 has a minimum width (W1) of about 0.23 microns, and a minimum spacing (S1) of about 0.23 microns. Similarly, in accordance with the 0.18 micron SOI CMOS process node, each of the tungsten contacts 231-234 has a minimum width ($W_C$) of about 0.22 microns, and each of the tungsten vias 245-248 and 256-258 has a minimum width ($W_V$) of about 0.26 microns.

Aluminum traces 241-444, 251-255 and 271-272 have a sheet resistance of about 85 mOhms/square. The resistances of the aluminum traces contribute to the on-resistances ($R_{ON}$) of associated RF switches 110 and 120, which use these aluminum traces to couple the various SOI CMOS transistors $110_1$-$110_N$ and $120_1$-$120_N$. The lengths, thicknesses and spacings of the aluminum traces contribute to the off-capacitances ($C_{OFF}$) of the associated RF switches 110 and 120. The lengths and spacings of the aluminum traces also define the interconnect density, and therefore the required layout area of the associated RF switches 110 and 120. However, scaling down the length, thickness and spacing of the aluminum traces will undesirably result in higher resistances and lower reliability. Moreover, changing the composition of the aluminum traces will undesirably change the operating characteristics and reliability of the conventional MIM structure 260.

It would therefore be desirable to have an improved RF switch structure and method for fabricating the same. It would be desirable for the improved RF switch structure to have a reduced on-resistance $R_{ON}$, a reduced off-capacitance $C_{OFF}$, and an improved layout density, without adversely affecting the fabrication of MIM structures. It would further be desirable if this improved RF switch structure can be fabricated using a process that is substantially consistent with existing conventional fabrication process nodes.

SUMMARY

Accordingly, the present invention provides an RF switch that includes a plurality of SOI CMOS transistors. A first metal layer (M1) includes traces (that are coupled to contacts) to connect the SOI CMOS transistors in series to form the RF switch. The first metal layer has a first metal composition. Additional metal layers are formed over the first metal layer, wherein the additional metal layers have a second metal composition, different than the first metal composition. As described herein, the composition of a metal layer refers to the composition of the main portion of the metal layer, and does not include the composition of associated conductive liner layers formed before the main portion of the metal layer. In one embodiment the first metal composition is copper, and the second metal composition is a primarily aluminum composition (e.g., Al—Si, Al—Si—Cu or Al—Cu). In accordance with one embodiment of the present invention, the first metal composition has a lower resistivity than the second metal composition.

In one embodiment, the first metal layer is fabricated using a process node having a first minimum line width, and the additional metal layers (and the SOI CMOS transistors) are fabricated using a process node having a second minimum line width, greater than the first minimum line width. For example, the first metal layer can be fabricated in accordance with a 0.13 micron (or smaller) process node, and the additional metal layers (and the SOI CMOS transistors) can be fabricated in accordance with a 0.18 micron (or greater) process node. This configuration allows conventional MIM devices to be fabricated without modification, using the additional metal layers.

In one embodiment, the contacts (which connect traces of the first metal layer to the SOI CMOS transistors) can be fabricated in accordance with the same process node as the first metal layer. In alternate embodiment, these contacts can be fabricated in accordance with the same process node as the additional metal layers and the SOI CMOS transistors.

In one embodiment, the traces of the first metal layer are thinner than the traces of the additional metal layers.

In one embodiment, the minimum widths of traces of first metal layer are smaller than the minimum widths of traces of the additional metal layers. In an alternate embodiment, the minimum widths of traces of first metal layer are similar to the minimum widths of traces of the additional metal layers.

In one embodiment, a minimum spacing between traces of the first metal layer is similar to a minimum spacing between traces of the additional metal layers. In an alternate embodiment, a minimum spacing between traces of the first metal layer is smaller than a minimum spacing between traces of the additional metal layers.

In accordance with the embodiments described above, traces of the first metal layer exhibit a reduced resistance and/or a reduced capacitance with respect to traces of the additional metal layers, thereby advantageously reducing the $R_{ON} \times C_{OFF}$ value of the associated RF switch. In various embodiments described above, the construction of the first metal layer will result in a higher interconnect density, thereby enabling the RF switch to be fabricated with a smaller required layout area.

The present invention also includes methods for fabricating RF switches having the features described above.

The present invention will be more fully understood in view of the following description and drawings.

DETAILED DESCRIPTION

In general, the present invention includes an RF switch that includes a plurality of n-channel SOI CMOS transistors connected in series. The n-channel SOI CMOS transistors are fabricated in accordance with a first SOI CMOS process node. For example, n-channel SOI CMOS transistors may be fabricated in accordance with a 0.18 micron SOI CMOS process node. As described herein, an SOI CMOS process includes any process that can be used to fabricate SOI CMOS transistors. Thus, a process that can be used to integrate the fabrication of both SOI CMOS transistors and other types of transistors (e.g., SiGe BiCMOS transistors) is considered to be an SOI CMOS process. The interconnect structure used to couple the n-channel SOI CMOS transistors includes a first metal layer (M1) having a plurality of traces with a first metal composition (e.g., copper). The first metal layer is fabricated in accordance with a second SOI CMOS process node, which is more advanced than (i.e., has a smaller minimum feature size than) the first SOI CMOS process node. For example, the second SOI CMOS process node may be a 0.13 micron (or smaller) SOI CMOS process node. Additional metal layers are fabricated over the first metal layer in accordance with the first SOI CMOS process node. For example, the metal layers fabricated over the first metal layer may include aluminum traces fabricated in accordance with a 0.18 micron SOI CMOS process node. As a result, MIM structures fabricated in the additional metal layers may advantageously retain their previously specified construction (and reliability).

The thicknesses, widths and/or spacings of the traces of the first metal layer are selected to optimize the $R_{ON} \times C_{OFF}$ value and/or the resulting layout area of the associated RF switch. In one embodiment, the traces of the first metal layer can be designed to have lower resistances than the traces of the additional metal layers, thereby reducing the on-resistance ($R_{ON}$) of the associated RF switch. In another embodiment, the traces of the first metal layer can be designed to have both a lower on-resistance and a lower capacitance than traces of the additional metal layers, thereby reducing both the on-resistance ($R_{ON}$) and the off-capacitance ($C_{OFF}$) of the associated RF switch. In other embodiments, the traces of the first metal layer can be designed to have approximately the same on-resistance ($R_{ON}$) as the traces of the additional metal layers, but a higher current density, a lower off capacitance ($C_{OFF}$) and a smaller required layout area than the traces of the additional metal layers. The present invention will now be described in more detail.

Figure 2:
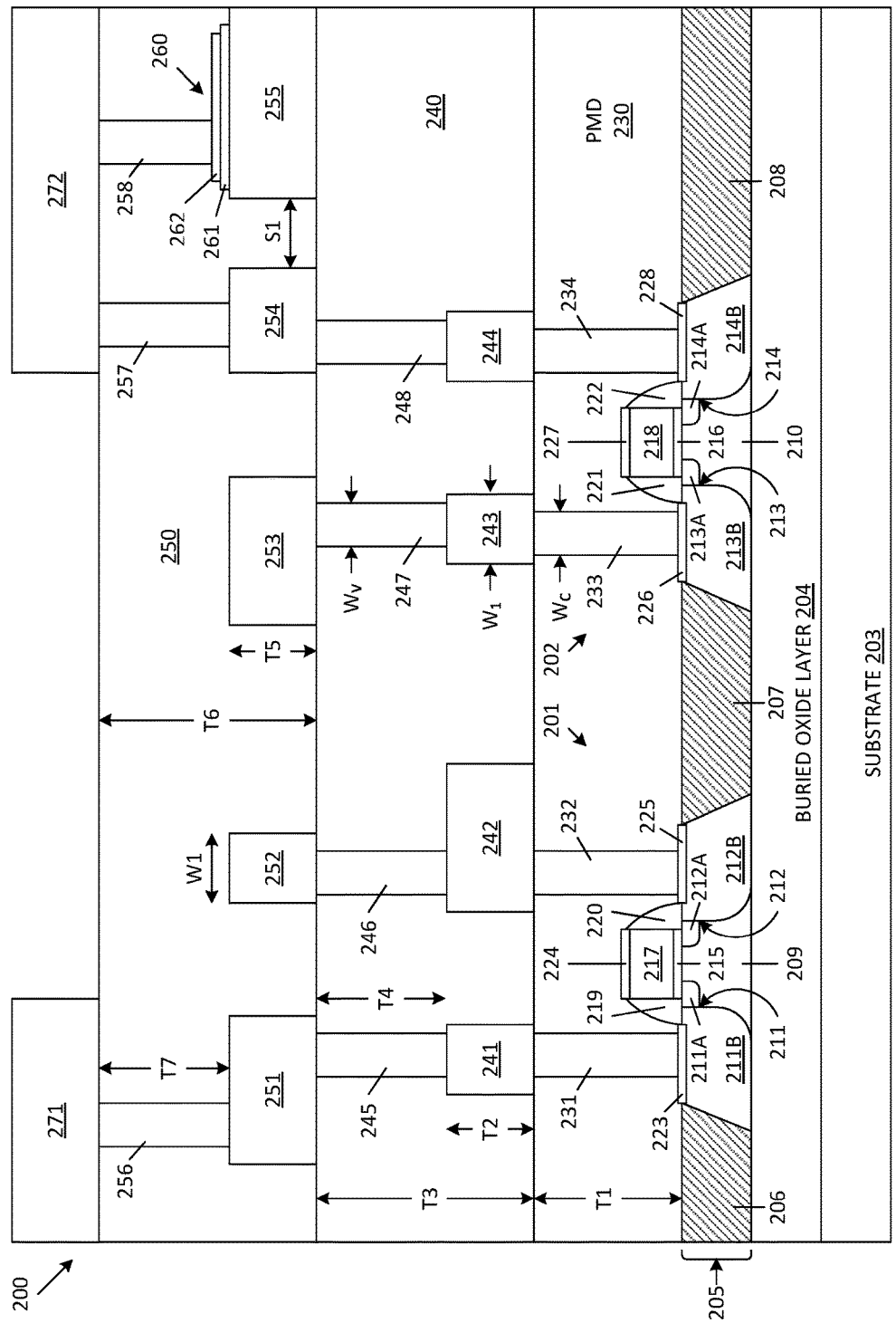
FIG. 2 is a cross-sectional view of a conventional SOI CMOS structure, which includes an n-channel SOI CMOS transistor and a p-channel SOI CMOS transistor, which are fabricated using a conventional 0.18 micron SOI CMOS process node.
Figure 3:
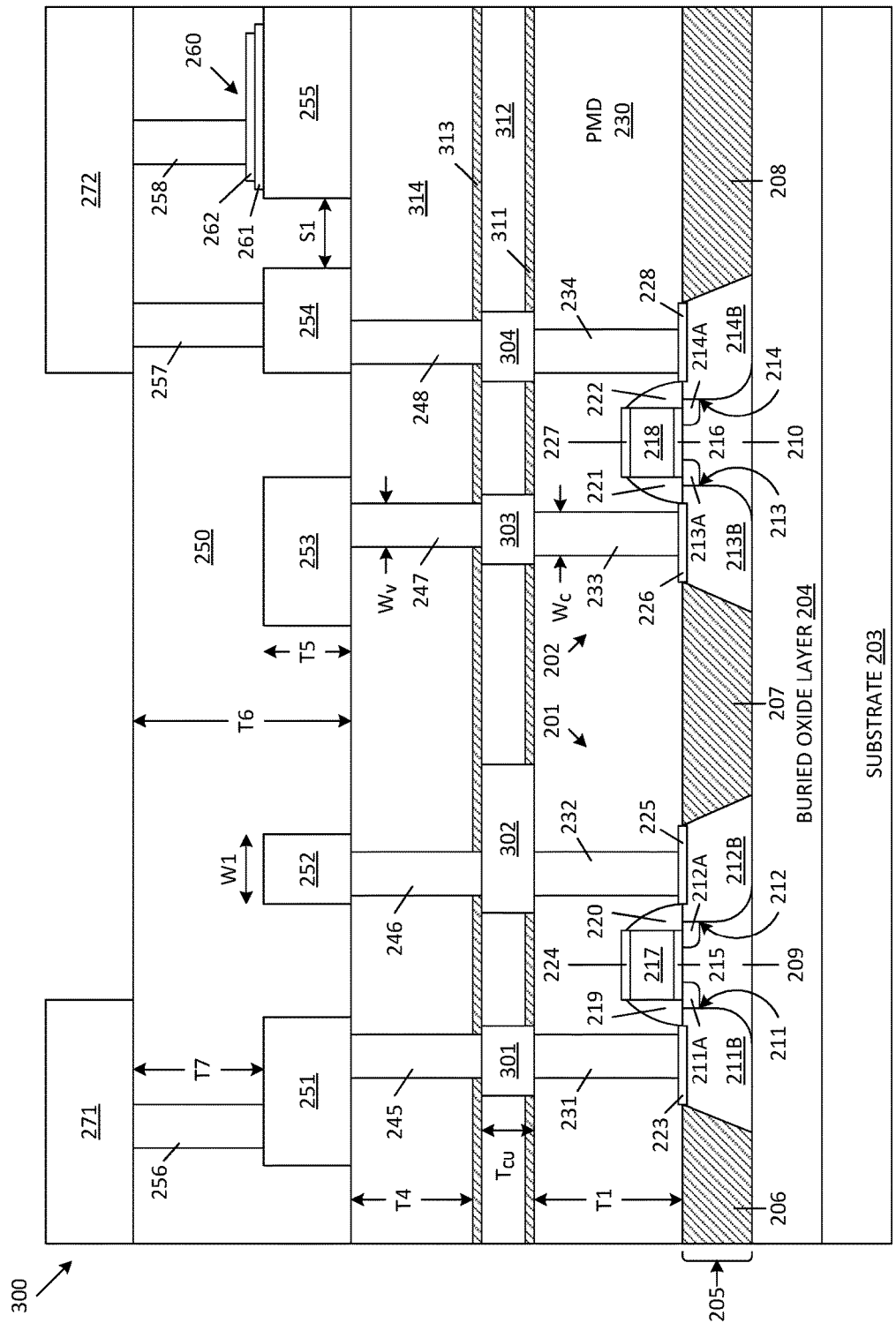
FIG. 3 is a cross-sectional view of an SOI CMOS structure that includes a first metal layer having a first metal composition, and additional metal layers having a second metal composition, in accordance with one embodiment of the present invention.

FIG. 3 is a cross-sectional view of an SOI CMOS structure 300 in accordance with one embodiment of the present invention. SOI CMOS structure 300 includes n-channel SOI CMOS transistor 201 and p-channel SOI CMOS transistor 202, which have been described above in connection with FIG. 2. Again, transistors 201 and 202 are fabricated using a conventional 0.18 micron SOI CMOS process node. Pre-metal dielectric (PMD) structure 230 having a thickness T1 of about 0.85 microns and a dielectric constant ε=4.2 is formed over transistors 201-202. Conductive metal contacts 231, 232, 233 and 234 extend through the PMD layer 230 and contact the silicide regions 223, 225, 226 and 228, respectively, as illustrated. In the embodiment illustrated, conductive metal contacts 231-234 are fabricating using a conventional 0.18 micron SOI CMOS process node. In this embodiment, contact openings are etched, a conductive barrier layer (e.g., titanium nitride) is formed in the contact openings, and a layer of tungsten (W) is deposited over the barrier layer, filling the contact openings. Portions of the conductive barrier layer and tungsten layer not located in the contact openings are removed (e.g., by chemical-mechanical polishing (CMP) processes). In accordance with a conventional 0.18 micron SOI CMOS process node, the contacts 231-234 have a width ($W_C$) of about 0.22 microns.

A first metal layer (M1) having a first metal composition (e.g., copper) is then formed over PMD structure 230, wherein copper traces 301-304 are formed using an advanced process node, for example, a 0.13 micron or 90 nm process node. In accordance with this advanced process node, a dielectric layer 311 is formed over PMD structure 230 (and contacts 231-234). This dielectric layer 311 may be, for example, silicon nitride deposited to a thickness of about 500 Angstroms. In other embodiments, dielectric layer 311 may be implemented by other films that function as an etch stop layer and also exhibit barrier properties (e.g., BLOk™ from Applied Materials). Another dielectric layer 312 is deposited over dielectric layer 311. This dielectric layer 312 may be, for example, silicon oxide deposited to a thickness of about 0.28 microns. Trenches (not shown), which define the locations of traces 301-304, are then etched through dielectric layers 312 and 311, exposing underlying contacts 231-234. A thin conductive barrier layer (e.g., tantalum (Ta) and/or tantalum nitride (TaN), which is not shown) is deposited in the trenches (and over the upper surface of dielectric layer 312), and then a thick layer of copper is formed over the thin barrier layer using conventional copper electroplating techniques. Portions of the copper layer and the thin barrier layer located over the upper surface of dielectric layer 312 are removed by chemical mechanical polishing (CMP) processes, thereby forming copper traces 301-304. As defined herein, the composition of a metal layer refers to the composition of the main portion of the metal layer, and does not include the composition of the associated conductive liner layer(s). Thus, the metal composition of the first metal layer (M1) is copper, as the main portion of the first metal layer is copper (even though the liner(s) associated with the first metal layer are Ta/TaN).

A metal trace having a metal composition of copper is referred to as a copper trace. Copper traces 301-304 each have a thickness $T_{CU}$ of about 0.33 microns. Note that the thickness $T_{CU}$ may vary within a range of +/−10-15 percent. The minimum widths and minimum spacing of copper traces 301-304 are selected to control the resistances, capacitances and required layout area of these traces in a manner described in more detail below in connection with FIGS. 5A-5D.

A dielectric layer 313 is formed over the resulting structure. In one embodiment, dielectric layer 313 is silicon nitride, deposited to a thickness of about 500 Angstroms. An inter-metal dielectric layer 314 having a thickness T4 of about 0.75 microns and a dielectric constant of about ε=4.2 is formed over dielectric layer 313. In one embodiment, inter-metal dielectric layer 314 is silicon dioxide (ε=4.2) or fluorinated silicon dioxide (ε=3.6).

Conductive metal vias 245-248 (each having a thickness T4 of about 0.75 microns) are formed through dielectric layers 313 and 314 to contact copper traces 301-304, respectively, of the first metal layer. In the illustrated embodiment, conductive metal vias 245-248 are tungsten (W) structures fabricated using a 0.18 micron SOI CMOS process node, such that these vias 245-245 have a minimum width $W_V$ of about 0.26 microns.

A second metal layer (M2) having a second metal composition (e.g., a primarily aluminum composition) is then formed over dielectric layer 314, wherein aluminum traces 251-255 are fabricated in accordance with the conventional 0.18 micron SOI CMOS process node. In accordance with the 0.18 micron SOI CMOS process node, aluminum traces have a thickness T5 of about 0.52 microns. MIM structure 260 (including dielectric layer 261 and conductive layer 262) is fabricated over aluminum trace 255 in accordance with the 0.18 micron SOI CMOS process node, in the manner described above in connection with FIG. 2. Advantageously, the MIM structure 260 is fabricated using a 0.18 micron SOI CMOS process node, such that the reliability and operating characteristics of the conventional MIM structure 260 are not adversely affected. Dielectric structure 250 is formed over the resulting structure, wherein dielectric structure 250 may have a thickness of about 1.27 microns and a dielectric constant ε=4.2. Conductive metal vias 256-258 are formed through dielectric structure 250 to provide electrical contact to metal traces 251, 254 and conductive layer 262, respectively. Again, vias 256-258 are fabricated in accordance with a 0.18 micron SOI CMOS process node, and have a minimum width $W_V$ of about 0.26 microns.

A third metal layer (M3) having the second metal composition (e.g., a primarily aluminum composition) is then formed over dielectric structure 250, wherein aluminum traces 271-272 are fabricated in accordance with a 0.18 micron SOI CMOS process node. Additional alternating layers of interconnect vias and metal layers are formed above the third metal layer using a 0.18 micron SOI CMOS process node. In a particular embodiment, an interconnect structure including six metal layers (M1-M6) is formed over transistors 201-202.

Thus, in accordance with one embodiment of the present invention, the first metal layer has a first metal composition (e.g., copper), and each of the additional metal layers has a second metal composition (e.g., a primarily aluminum composition). Moreover, the first metal layer is fabricated in accordance with a first SOI CMOS process node (e.g., a 0.13 micron SOI CMOS process node), and each of the additional metal layers is fabricated in accordance with a second SOI CMOS process node (e.g., a 0.18 micron SOI CMOS process node). As a result, the SOI CMOS structure 300 of the present invention can be fabricated with only minor modifications to a conventional 0.18 micron SOI CMOS process node (i.e., the present invention maintains a majority of conventional 0.18 micron layers and production line). Additional advantages of these configurations are described below.

Figure 1:
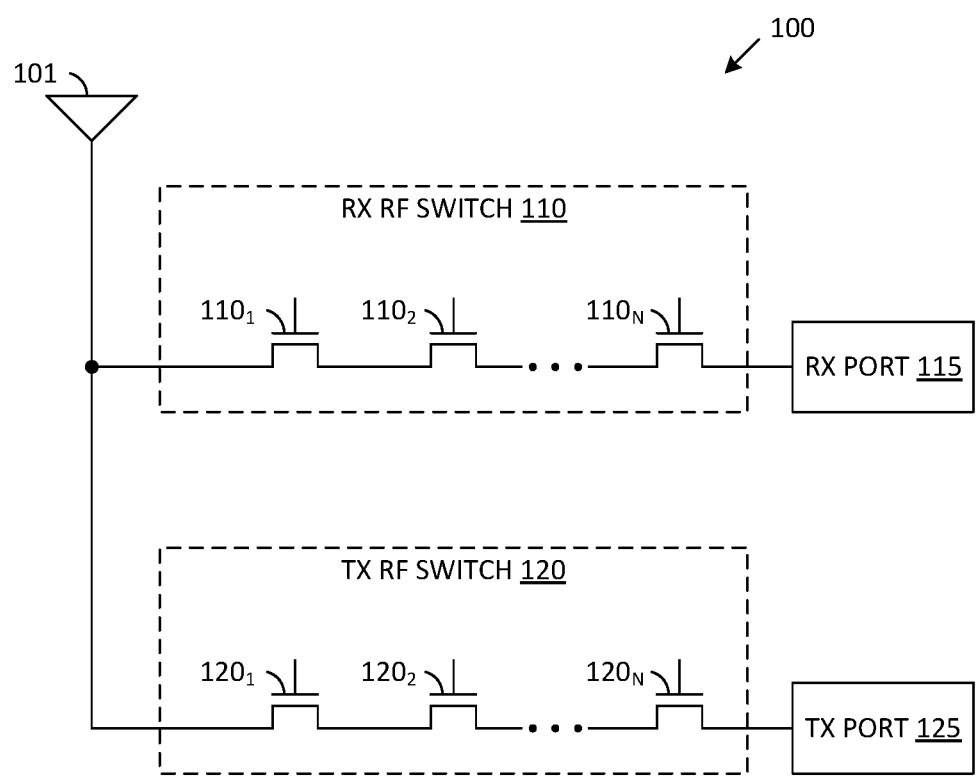
FIG. 1 is a circuit diagram of a conventional radio frequency (RF) circuit.

In accordance with the present invention, transistors similar to n-channel SOI CMOS transistor 201 are connected in series using the interconnect structure of FIG. 3 to form one or more RF switches (similar to RF switches 110 and 120 of FIG. 1). Transistors similar to n-channel SOI CMOS transistor 201 and p-channel SOI CMOS transistor 202 can also be connected using the interconnect structure of FIG. 3 to implement other circuitry associated with the RF switches (e.g., circuitry similar to that found within receive port 115 and transmit port 125 of FIG. 1).

In general, the thicknesses, widths and spacings of the copper traces of the first metal layer can be varied to provide specific advantages to an associated RF switch. These variations and advantages will be described in more detail below. From a materials perspective, an aluminum trace having a standard thickness of 0.52 microns (and a unit width), has about 1.5 times the volume of a copper trace having a standard thickness of 0.33 microns (and a unit width). The resistivity (Ohm-cm) of a copper trace is about half the resistivity of an aluminum trace. Per unit length, per unit width, a copper trace has a lower resistance (Ohms/square) than an aluminum trace. For example, an aluminum trace having a standard thickness of 0.52 microns and a width of 0.23 microns has a higher resistance than a copper trace having a standard thickness of 0.33 microns and a width of 0.23 microns. Thus, a copper trace having a standard thickness of 0.33 microns can have a smaller width than an aluminum trace having a standard thickness of 0.52 microns, while the copper trace and the aluminum trace have the same resistance.

Figure 4:
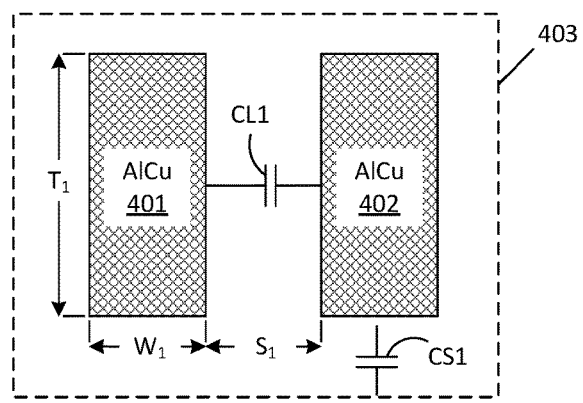
FIG. 4 is a cross sectional view of a pair of conventional aluminum metal 1 (M1) traces fabricated in accordance with a 0.18 micron CMOS process node.

FIG. 4 is a cross sectional view of a pair of conventional aluminum metal 1 (M1) traces 401-402 fabricated in accordance with a 0.18 micron SOI CMOS process node. Dashed box 403 represents the various dielectric materials surrounding aluminum traces 401-402, including dielectric materials that insulate aluminum traces 401-402 from one other, and from other conductive layers, including the underlying substrate. Each of the aluminum traces 401-402 has a thickness $T_1$ of 0.52 microns and a minimum width $W_1$ of 0.23 microns. The minimum spacing $S_1$ between aluminum traces 401-402 is 0.23 microns. In the illustrated embodiment, aluminum traces 401-402 are aluminum-copper (AlCu) (which include about 0.5% copper by weight), such that these traces have a sheet resistance of about 85 mOhms/square. The resistances of aluminum traces 401-402 contribute to the on-resistance ($R_{ON}$) of an associated RF switch that includes these traces 401-402. A line-to-line capacitance CL1 exists between aluminum traces 401-402. A line-to-substrate capacitance CS1 exists between aluminum traces 401-402 and the underlying substrate (e.g., silicon layer 205). These capacitances CL1 and CS1 contribute to the off-state capacitance ($C_{OFF}$) of an associated RF switch that includes traces 401-402.

Figure 5A:
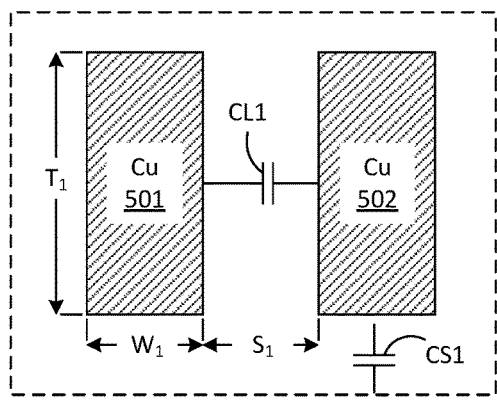
FIG. 5A is a cross sectional view of pairs of copper metal 1 (M1) traces fabricated in accordance with a modified 0.13 micron CMOS process node.
Figure 5B:
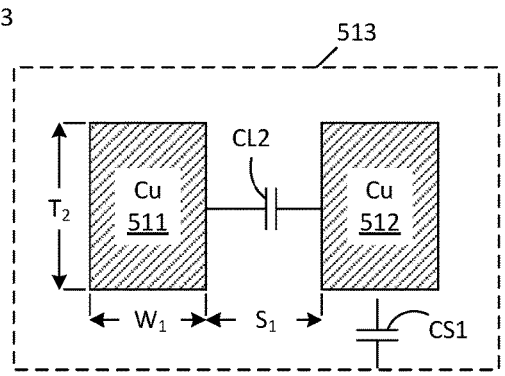
FIGS. 5B, 5C and 5D are cross sectional views of pairs of copper metal 1 (M1) traces fabricated in accordance with a 0.13 micron CMOS process node.
Figure 5C:
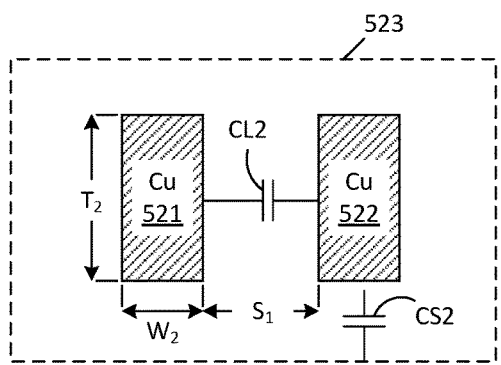
Figure 5D:
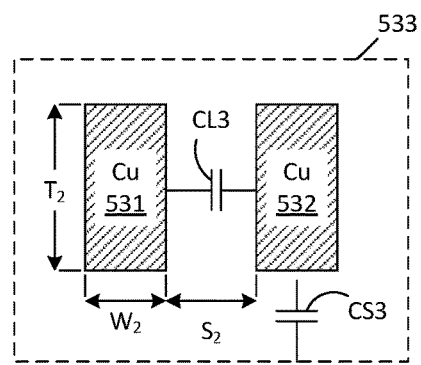

FIG. 5A is a cross sectional view of a pair of copper metal 1 (M1) traces fabricated in accordance with a modified 0.13 micron SOI CMOS process node in accordance with one embodiment of the present invention. FIGS. 5B-5D are cross sectional views of pairs of copper metal 1 (M1) traces fabricated in accordance with a conventional 0.13 micron SOI CMOS process node in accordance with various embodiments of the present invention. Note that any of the embodiments of FIGS. 5A-5D can be used to provide connections to the re-channel SOI CMOS transistors of an RF switch, while providing the specific advantages set forth below.

FIG. 5A illustrates copper traces 501-502, each of which has a thickness $T_1$ of 0.52 microns and a minimum width $W_1$ of 0.23 microns. Note that a conventional 0.13 micron SOI CMOS process node must be slightly modified to enable copper traces 501-502 to have the relatively large thickness of 0.52 microns. The minimum spacing $S_1$ between copper traces 501-502 is 0.23 microns. That is, the dimensions of copper traces 501-502 are approximately the same as the dimensions of aluminum traces 401-402. Thus, the use of copper traces 501-502 does not reduce the required layout area of an associated RF switch. Copper traces 501-502 have a lower sheet resistance than aluminum traces 401-402, such that the resistances of copper traces 501-502 are about half the resistances of aluminum traces 401-402. Thus, substituting copper traces 501-502 for aluminum traces 401-402 will reduce the on-resistance ($R_{ON}$) of an associated RF switch.

Dashed box 503 represents the various dielectric materials surrounding copper traces 501-502. Note that copper traces 501-502 exhibit substantially the same capacitances CL1 and CS1 as aluminum traces 401-402, and therefore do not reduce the off-capacitance ($C_{OFF}$) of an associated RF switch. Thus, in this embodiment, $R_{ON} \times C_{OFF}$ of the associated RF switch is advantageously reduced.

FIG. 5B illustrates copper traces 511-512, each of which has a thickness $T_2$ of 0.33 microns and a minimum width $W_1$ of 0.23 microns. Dashed box 513 represents the various dielectric materials surrounding copper traces 511-512. The minimum spacing $S_1$ between copper traces 511-512 is 0.23 microns. Thus, copper traces 511-512 (FIG. 5B) are thinner than copper traces 501-502 (FIG. 5A). As a result, the line-to-line capacitance CL2 of copper traces 511-512 is lower than the line-to-line capacitance CL1 of aluminum traces 401-402 (and the line-to-line capacitance CL1 of copper traces 501-502). More specifically, the line-to-line capacitance CL2 of copper traces 511-512 is about 0.63 times the line-to-line capacitance CL1 of aluminum traces 401-402. Thus, the capacitance per unit area of copper traces 511-512 is less than the capacitance per unit area of aluminum traces 401-402. The resistances of copper traces 511-512 are lower than the resistances of aluminum traces 401-402. Thus, substituting copper traces 511-512 for aluminum traces 401-402 will reduce both the on-resistance ($R_{ON}$) and the off-capacitance ($C_{OFF}$) of an associated RF switch (i.e., $R_{ON} \times C_{OFF}$ of the RF switch is reduced).

FIG. 5C illustrates copper traces 521-522, each of which has a thickness $T_2$ of 0.33 microns and a minimum width $W_2$ of 0.16 microns. Dashed box 523 represents the various dielectric materials surrounding copper traces 521-522. The minimum spacing $S_1$ between copper traces 521-522 is 0.23 microns. Thus, copper traces 521-522 (FIG. 5C) are narrower than aluminum traces 401-402 (FIG. 4), copper traces 501-502 (FIG. 5A) and copper traces 511-512 (FIG. 5B). As a result, the resistances of copper traces 521-522 are substantially similar to the resistances of aluminum traces 401-402. Note however, that copper traces 521-522 exhibit the same resistance for a smaller area (or a lower resistance for the same area) with respect to aluminum traces 401-402. Thus, copper traces 521-522 can provide the same current density as aluminum traces 401-402 in a smaller area. In the illustrated embodiment, copper traces 521-522 have a resistance of about 87 mOhms/square. The line-to-line capacitance CL2 of copper traces 521-522 is about the same as the line-to-line capacitance CL2 of copper traces 511-512. More specifically, the line-to-line capacitance CL2 of copper traces 521-522 is about 0.63 times the line-to-line capacitance CL1 of aluminum traces 401-402. Because the copper traces 521-522 are narrower than aluminum traces 401-402 (FIG. 4), copper traces 501-502 (FIG. 5A) and copper traces 511-512 (FIG. 5B), these copper traces 521-522 exhibit a lower line-to-substrate capacitance CS2 than the line-to-substrate capacitance CS1 of traces 401-402, 501-502 and traces 511-512. Thus, the capacitance per unit area of copper traces 521-522 is less than the capacitance per unit area of aluminum traces 401-402. Substituting copper traces 521-522 for aluminum traces 401-402 will reduce the off-capacitance ($C_{OFF}$) of an associated RF switch, while maintaining substantially the same on-resistance ($R_{ON}$) of the associated RF switch (i.e., $R_{ON} \times C_{OFF}$ of the RF switch is reduced).

FIG. 5D illustrates copper traces 531-532, each of which has a thickness $T_2$ of 0.33 microns and a minimum width $W_2$ of 0.16 microns. Dashed box 533 represents the various dielectric materials surrounding copper traces 531-532. The minimum spacing $S_1$ between copper traces 531-532 is 0.18 microns. Thus, copper traces 531-532 are spaced closer together than aluminum traces 401-402 (FIG. 4), copper traces 501-502 (FIG. 5A), copper traces 511-512 (FIG. 5B) and copper traces 521-522 (FIG. 5C). As a result, the line-to-line capacitance CL3 between copper traces 531-532 is larger than the line-to-line capacitance CL2 between traces 521-522 (or traces 511-512). The line-to-line capacitance CL3 between copper traces 531-532 is similar to the line-to-line capacitance CL1 between aluminum traces 401-402 (and copper traces 501-502). The line-to-substrate capacitance CS3 between copper traces 531-532 and the underlying substrate is slightly greater than the line-to-substrate capacitance CS2 between traces 521-522 and the underlying substrate (but is less than the line-to-substrate capacitance CS1). Note that the capacitance per unit area of copper traces 531-532 is less than the capacitance per unit area of aluminum traces 401-402. The resistances of copper traces 531-532 are substantially similar to the resistances of aluminum traces 401-402 and copper traces 521-522 (and thus copper traces 531-532 exhibit the same resistance-based advantages described above for copper traces 521-522). Thus, substituting copper traces 531-532 for aluminum traces 401-402 will reduce the off-capacitance ($C_{OFF}$) of an associated RF switch, while maintaining substantially the same on-resistance ($R_{ON}$) of the associated RF switch (i.e., $R_{ON} \times C_{OFF}$ of the RF switch is reduced).

The smaller trace width and spacing of the embodiments of FIGS. 5C and 5D advantageously result in higher interconnect densities. In general, the first metal layer M1 is responsible for resistance into the page (routing), as well as being a landing pad for the via above, and an interconnect to the contact below. In the case of vias and contacts, a M1 metal trace typically requires some overplot to the via above and to the contacts below, to accommodate misalignment in manufacturing of these layers to each other. The M1 metal trace is also a line, and is next to another line, thus the spacing (area) between metal lines (shown in FIGS. 5A-5D) is a limitation. Resistance decreases when lines are drawn wider, but then the spacing to the neighbor line becomes smaller, and thus increases capacitance. There is a tradeoff with line width vs. spacing. The vias and contacts do not tend to be slotted—they are discrete holes, and thus contribute to lateral capacitance much less than the M1 metal traces.

In an RF switch application, wherein stacks/arrays of n-channel SOI CMOS transistors are connected to form the RF switch, the design rule that limits the shrinking of the entire RF switch exists in the first metal layer (M1). Thus, by minimizing the widths and spacings of the copper traces in the first metal layer (M1) in the manner described by FIGS. 5C and 5D above, the required layout area of the associated RF switch is advantageously minimized (i.e., the RF switch can be fabricated on a smaller chip). In the embodiment illustrated by FIG. 3, the contacts 231-234 are fabricated in accordance with the same 0.18 micron process node as the transistors 201-202. As described above, this process results in contacts 231-234 having a width $W_C$ of about 0.22 microns. However, in an alternate embodiment, the contacts 231-234 are fabricated in accordance with the design rules of the 0.13 micron SOI CMOS process node. In this embodiment, the widths of contacts 231-234 are reduced (e.g., to 0.16 microns), thereby further improving the interconnect density (at the cost of slightly complicating the fabrication process).

Although the invention has been described in connection with several embodiments, it is understood that this invention is not limited to the embodiments disclosed, but is capable of various modifications, which would be apparent to a person skilled in the art. Thus, although the 0.18 micron SOI CMOS process node described above is used to fabricate SOI CMOS transistors 201-202 as illustrated by FIG. 3, it is understood that this process can also be used to fabricate other types of transistors (e.g., SiGe BiCMOS transistors) on the same silicon layer 205. Thus, the invention is limited only by the following claims.

We claim:

1. A method of fabricating a radio frequency (RF) switch comprising:
   fabricating a plurality of silicon-on-insulator (SOI) CMOS transistors;
   forming a pre-metal dielectric layer formed over the plurality of SOI CMOS transistors;
   forming a plurality of contacts that extend through the pre-metal dielectric layer and provide electrical connections to the plurality of SOI CMOS transistors;
   forming a first metal layer comprising a plurality of metal traces over the pre-metal dielectric structure, wherein the first metal layer has a first metal composition;
   forming a plurality of additional metal layers over the first metal layer, wherein the plurality of additional metal layers having a second metal composition, different than the first metal composition;
   fabricating the plurality of SOI CMOS transistors and the additional metal layers in accordance with a first process node having a first minimum line width; and
   fabricating the first metal layer in accordance with a second process node having a second minimum line width, which is less than the first minimum line width.

2. The method of claim 1, wherein the first metal composition is copper.

3. The method of claim 2, wherein the second metal composition is a primarily aluminum composition.

4. The method of claim 1, wherein the first minimum line width is 0.18 microns or larger.

5. The method of claim 4, wherein the second minimum line width is 0.13 microns or smaller.

6. The method of claim 5, further comprising forming the additional metal layers such that traces in these additional metal layers have a minimum width of at least about 0.23 microns.

7. The method of claim 6, further comprising forming the contacts to have a minimum width of about 0.22 microns.

8. The method of claim 6, further comprising forming the contacts to have a minimum width of about 0.16 microns.

9. The method of claim 4, further comprising forming the first metal layer to a first thickness, and forming each of the additional metal layers to a second thickness, greater than the first thickness.

10. The method of claim 1, further comprising fabricating the contacts in accordance with the first process node.

11. The method of claim 1, further comprising fabricating the contacts in accordance with the second process node.

12. The method of claim 1, further comprising fabricating a metal-insulator-metal (MIM) semiconductor device using the additional metal layers.

13. The method of claim 1, wherein the first metal composition has a lower resistivity than the second metal composition.

14. The method of claim 1, wherein a minimum spacing between traces of the first metal layer is similar to a minimum spacing between traces of the additional metal layers.

15. The method of claim 1, wherein minimum widths of traces of the first metal layer are smaller than minimum widths of traces of the additional metal layers.

16. The method of claim 15, wherein a minimum spacing between traces of the first metal layer is similar to a minimum spacing between traces of the additional metal layers.

17. The method of claim 1, wherein the sheet resistances of traces of the first metal layer are similar to sheet resistances of traces of the additional metal layers.

* * * * *